United States Patent
Eden

[19]

[11] Patent Number: 6,114,696
[45] Date of Patent: Sep. 5, 2000

[54] UNCOOLED INFRARED DETECTOR

[75] Inventor: Dayton D. Eden, Dallas, Tex.

[73] Assignee: Lockheed Martin Corporation, Bethesda, Md.

[21] Appl. No.: 06/901,071

[22] Filed: Jul. 14, 1986

[51] Int. Cl.$^7$ .............................. G01J 5/00; H01Q 1/00; H01L 29/80; H01L 31/00
[52] U.S. Cl. .................. 250/338.1; 257/258; 257/275; 257/442; 257/448; 343/721; 343/727; 343/793; 250/338.4
[58] Field of Search ................................ 250/330, 332, 250/338 SE, 338, 352, 578, 338.1, 338.4; 343/721, 727, 793; 257/258, 275, 442, 440

[56] References Cited

U.S. PATENT DOCUMENTS

| 4,445,050 | 4/1984 | Marks | 250/212 X |
| 4,614,957 | 9/1986 | Arch et al. | 357/16 |

FOREIGN PATENT DOCUMENTS 2051477  1/1981  United Kingdom .

OTHER PUBLICATIONS

Schwarz et al, J. Appl. Phys., vol. 48, No. 5, May 1977, pp. 1870–1872.
"Planar Multimode Detector Arrays for Infrared and Millimeter–Wave Applications", D.B. Rutledge & S.E. Schwarz, IEEE Journal of Quantum Electronics, vol. QE17, No. 3, Mar. 1981.
"Solid–State Superlattices", Gottfired H. Dohler, pp. 144–151.
"HgCdTe Heterojunction Contact Photoconductor", D. L. Smith, D.K. Arch, R.A. Wood & M. Walter Scott, Appl. Phys. Lett., vol. 45, No. 1, Jul. 1984.
"Organic Crystals and Polymers—A New Class of Nonlinear Optical Materials", Garito & Singer, Dept. of Physics and Laboratory Research on the Structure of Matter, Univ. of Pennsylvania.
"The CdTe/HgTe Superlattice: Proposal for a New Infrared Material", J.N. Schulman & T.C. McGill, Appl. Phys. Lett 34(1), May 15, 1979, pp. 663–665.
"Theory of Generation–Recombination Noise in Intrinsic Photoconductors", D.L. Smith, J. Appl. Phys. Lett. 53(10), Oct., 1982, pp. 7051–7060.
"Microbolometers for Infrared Detection", T. Hwang, S.E. Schwarz & D.B. Rutledge, Appl. Phys. Lett. 34(11), Jun. 1, 1979, pp. 773–776.
"Molecular Beam Epitaxial Growth of High Quality HgTe and $Hg_{1-x}Cd_x$ Te Onto GaAs (001) Substrates", J.P. Faurie, S. Sivananthan, M. Boukerche & J. Reno, Appl. Phys. Lett. 45(12), Dec. 15, 1984, pp. 1307–1309.
"Effects of Blocking Contacts on Generation–Recombination Noise and Responsivity in Intrinsic Photoconductors", D.L. Smith, J. Appl. Phys. 56(6), Sep. 15, 1984, pp. 1663–1669.

*Primary Examiner*—Stephen C. Buczinski
*Attorney, Agent, or Firm*—Sidley & Austin; Stephen S. Sadacca

[57] ABSTRACT

An infrared radiation detector device comprises a dipole antenna mounted on a substrate and connected through blocking contacts to a bandgap detector element. The dipole antenna has a length which is approximately one half the wavelength of the incident infrared radiation. The bandgap detector element has linear dimensions which are each substantially smaller than the wavelength of the detected radiation. A group of detector devices are combined to form an array which can produce a pixel signal for an image. Unlike conventional infrared radiation detectors, the disclosed detector device is capable of producing a usable output signal without the need for cooling below ambient temperature.

33 Claims, 2 Drawing Sheets

UNCOOLED INFRARED DETECTOR

FIELD OF THE INVENTION

The present invention pertains in general to infrared detectors and in particular to such a detector which can produce a useful output signal without the need for cooling the detector.

BACKGROUND OF THE INVENTION

Infrared detectors have long been used in thermal imagers for viewing at night, or for viewing through clouds, smoke and dust. A conventional infrared imager has an array of large-area detectors wherein each detector corresponds to a single picture element (pixel) for an image. Each detector is a planer structure which has both the length and width dimensions larger than the wavelength of the incident radiation such that the detector has a adequate collection area for the incident radiation.

A principal limitation in the use of conventional infrared imagers has been the requirement that the imaging device be enclosed within a very cold chamber. The cooling for such devices has most often been provided by the evaporation of liquid gases, such as nitrogen. However, the storage, piping and handling of coolants such as liquid nitrogen has proven to be difficult, time consuming and expensive.

In view of the need for thermal imaging and the difficulties involved in supplying the cooling for the imagers, there exists a need for an infrared radiation detecting device which can function and produce useful signals at ambient temperature.

SUMMARY OF THE INVENTION

A selected embodiment of the present invention is a device for detecting incident radiation. The device includes a support structure which has a dipole antenna mounted on it. The length of the antenna is equal to approximately one half the wavelength of the incident radiation. The device further includes a quantum detector element which is mounted on the support structure and is connected to the dipole antenna. The detector element is fabricated to have each of the linear dimensions thereof substantially less than the wavelength of the incident radiation. The incident radiation is captured by the dipole antenna and transferred to the detector element for producing an output signal to indicate detection of the incident radiation at the device.

Further embodiments of the present invention include an array of such devices and an imager comprising a plurality of such arrays.

BRIEF DESCRIPTION OF THE DRAWINGS

For a more complete understanding of the present invention reference is now made to the following detailed description taken in conjunction with the drawings in which.

DETAILED DESCRIPTION OF THE INVENTION

Figure 1:
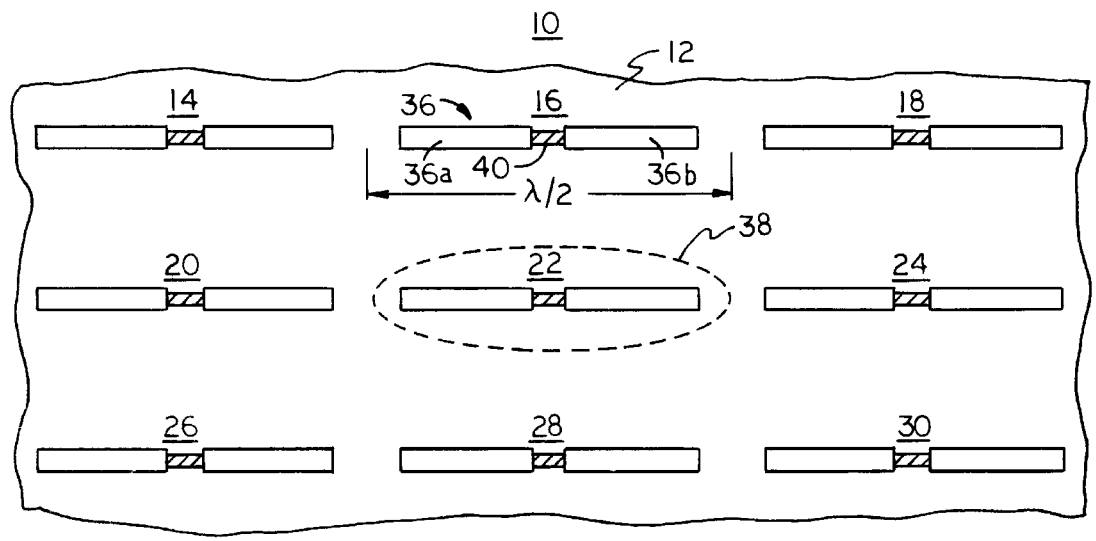
FIG. 1 is a plan view of an array of devices in accordance with the present invention for detecting incident radiation.

Referring now to FIG. 1, there is illustrated an infrared (IR) radiation detector array 10 in accordance with the present invention. The array 10 includes a support structure 12 which provides physical support and necessary electrical properties such as nonconductivity. A plurality of identical detector devices 14, 16, 18, 20, 22, 24, 26, 28 and 30 make up a 3×3 matrix for the array 10. The detection device 16 will be described in detail, however, it is representative of the remaining devices within the array 10. The detecting device 16 includes a dipole antenna 36 which includes antenna elements 36a and 36b. The antenna 36 is fabricated of a conductive material such as, for example, aluminum. The wavelength of incident radiation is indicated by the symbol lambda ($\lambda$). The length of the dipole antenna 36 is approximately one-half the wavelength of the incident radiation. Each of the detecting devices 14–30 has a capture area which is illustrated for detector device 22 by the dotted oval 38 surrounding device 22. It can be seen that the detecting devices 14–30 are positioned such that a substantial part of the incident radiation is captured by the dipole antennas.

Between the antenna elements 36a and 36b there is provided a bandgap detector element 40 which is mounted on the support structure 12 and is electrically connected to the antenna elements 36a and 36b. Blocking contacts, described below, provide electrical connections between the antenna elements 36a, 36b and the detector element 40.

The support structure 12 has a thickness which is approximately one fourth the wavelength of the incident radiation. Selected materials for the structure 12 are zinc selenide or zinc sulfite.

The array 10 can serve as a pixel element in an infrared imager, as further described below in reference to FIG. 4. In such an application the detector devices, such as 16, for all of the detector devices in the array 10, are joined in common to produce a pixel signal. However, it is also possible to have each detector device, such as 16, individually generate a pixel signal.

Figure 2:
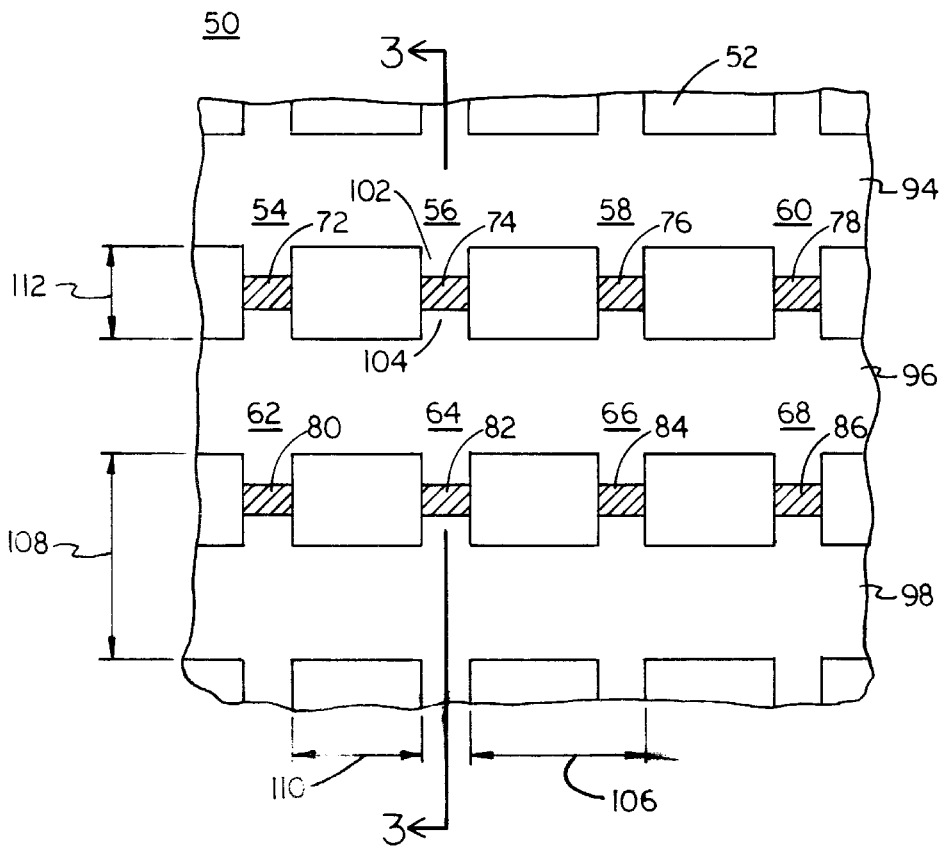
FIG. 2 is a plan view of an alternate embodiment of an array of infrared radiation detection devices in accordance with the present invention.

Referring now to FIG. 2, there is illustrated a second configuration for the present invention. This configuration is an array 50 which has a support structure 52. The structure 52 is similar to structure 12 described above. The array 50 is a 2×4 matrix comprising detector devices 54, 56, 58, 60, 62, 64, 66 and 68. Each of the detector devices, such as 56, includes a detection element and a dipole antenna. The detector devices 54–68 include respective detector elements 72–86. Each detector element is positioned between and connected to two planar metal antenna elements which serve as a dipole antenna for each detector element. The antenna elements are included in metal areas 94, 96 and 98. For example, device 56 includes detector element 74 which is connected via blocking contacts, described below, to a dipole antenna which comprises metal members 102 and 104 which are respectively parts of metal areas 94 and 96.

The configuration shown in FIG. 2 permits an output signal to be produced between metal areas 94 and 98 due to the electrical responses produced by the detector elements 72–86 upon receipt of incident radiation.

The horizontal cell spacing of the structure 50 is shown by line 106, the vertical cell spacing by line 108, the horizontal cell aperture by line 110 and the vertical cell aperture by line 112. For detecting infrared radiation having a wavelength of 10 microns, the horizontal and vertical cell spacings are approximately 5 microns and the cell apertures are approximately 4.5 microns. Each of the detector elements 72–86 has dimensions which are approximately 0.75 by 0.25 microns. Thus, the dimensions of the detector elements are substantially less than the wavelength of the intercepted radiation. For 5 micron wavelength IR radiation, each of the above linear dimensions is reduced by approximately one half, but the detector element is still approximately the same size.

Figure 4:
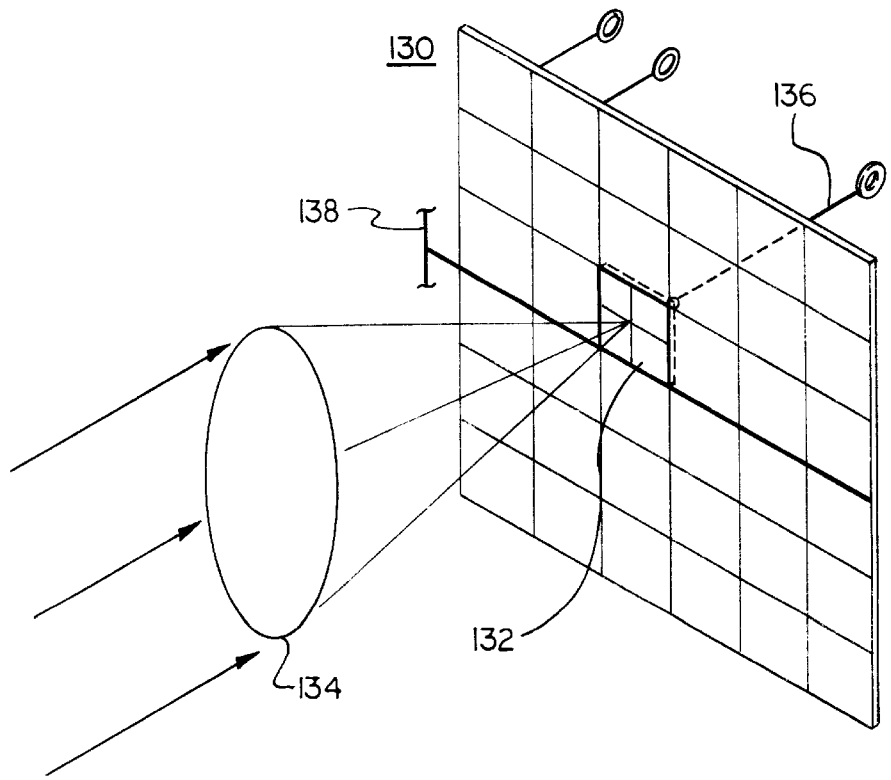
FIG. 4 is a perspective view of an infrared radiation imager in accordance with the present invention utilizing either of the infrared radiation detector arrays illustrated in FIGS. 1 and 2.

The array 50 likewise can serve as a pixel signal source within an imager having a large number of such arrays, as shown in FIG. 4.

Figure 3:
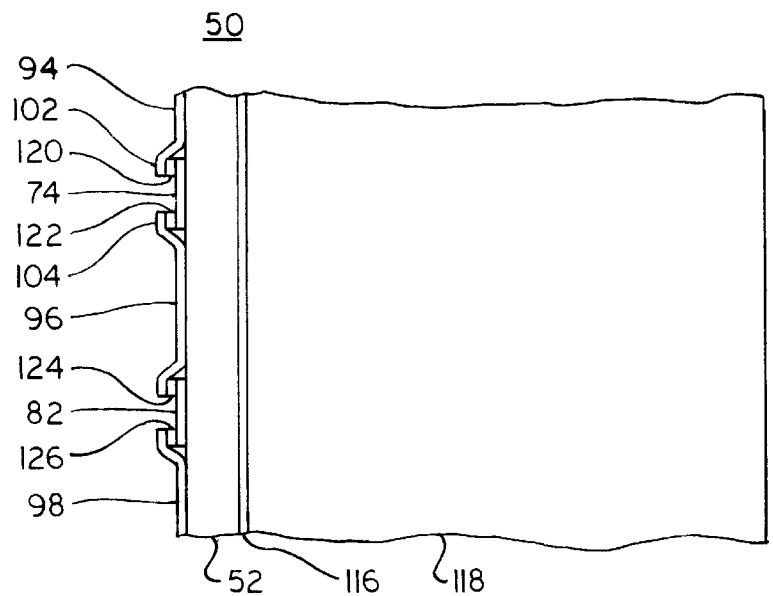
FIG. 3 is a section view taken along lines 3—3 of the infrared radiation detection device shown in FIG. 2.

Array 50 is further illustrated in a section view in FIG. 3. A reflective layer 116, such as metal, for example aluminum or a multilayer dielectric, is located between the support structure 52 and an insulating substrate 118. Layer 116 serves as a ground plane. A preferred composition of the substrate 118 is a silicon substrate, which is a part of a silicon charge coupled device (CCD) chip that processes the signal produced by array 50.

The detector element 74 is electrically connected to the dipole antenna metal members 102 and 104 by means of blocking contacts. Elements 72–86 are preferably an alloy of mercury cadmium telluride in which the fractional part of cadmium is represented by x and the fractional part of mercury is represented by 1–x. The preferred mercury cadmium telluride alloy for the detector elements 72–86 has x=0.15. The array 50, referring to FIG. 3, includes blocking contacts 120, 122, 124 and 126. Contact 120 is a layer which is on and in contact with the outer surface of detector 74. The metal member 102 is fabricated directly over the contact 120. Member 102 is electrically connected to contact 120 but is not directly connected to the detector 74. Contact 122 is similarly positioned between detector 74 and metal member 104. Contact 124 is positioned between detector 82 and a part of the metal area 96. And likewise, blocking contact 126 is positioned between detector 82 and a part of metal area 98. The blocking contacts 120, 122, 124 and 126 comprise a mercury cadmium telluride alloy having x=0.19.

The purpose of the blocking contacts 120, 122, 124, and 126 is to prevent the diffusion of change carriers from the detector elements, such as 74, into the aluminum metal members, such as 102 and 104. It is desirable to have a recombination velocity of less than 500 cm/sec, but a direct aluminum contact to the detector results in a recombination velocity which approaches infinity. By including the blocking contacts, such as 120, 122, 124 and 126 between the detector elements and the metal dipole members, the recombination velocity of the carriers is reduced to the range of 300–500 cm/sec. The blocking contacts and associated elements function much like high frequency coupling capacitors to provide dc isolation of the carriers but present only a small impedance between the detector elements and the dipole antenna elements. The theory and detailed operation of a blocking contact of this type is described in "HgCdTe Heterojunction Contact Photoconductor," Applied Physics Letters 45(1), Jul. 1, 1984, pp. 83–85 by D. L. Smith, D. K. Arch, P. A. Wood and M. Walter Scott.

The detector elements, such as 40 and 74 discussed above are direct bandgap detectors. A bandgap detector of this type produces an electrical signal as a result of interaction between the incident photons and the electrons (holes) in the material. A detector element of this type is not subject to thermal (phonon) exchange noise as are bolometer detectors and the like. Bandgap detectors are therefore not severely limited in performance at high (ambient) temperatures as are conventional bolometer and similar detectors.

A preferred material for the detector elements 40 and 72–88 is a crystal of mercury cadmium telluride. A further material can be indium antimonide. Another suitable detector element can be a semiconductor superlattice as described in Scientific American, "Solid State Superlattices," November 1983 by Gottfried H. Dohler. A still further detector element can be an organic material as described in Laser Focus, "Organic Crystals and Polymers—A new Class of Nonlinear Optical Materials," February 1982, pp. 59–64 by Anthony F. Garito and Kenneth H. Singer. By using the organic material described in the reference to Garito and Singer, it is possible to have coherent detection of the incident radiation.

An imager 130 in accordance with the present invention is illustrated in FIG. 4. The imager comprises a plurality of individual arrays, such as 132. The array 132 may, for example, be the same as array 10 or 50 described above. An infrared image is transmitted through a lens 134 onto the planar imager 130. Each of the arrays produces a pixel signal which, for array 132, is transmitted through a line 136. There is a corresponding line for each array within the imager 130. The collection and processing of all pixel signals forms a reproduction of the original image transmitted through lens 134. A line 138 can provide a common ground which extends throughout the imager 130.

One method in accordance with the present invention for fabricating the bandgap detector elements is described as follows. A layer of cadmium telluride is first epitaxially grown on a substrate to a thickness of 1–2 microns. This grown cadmium telluride layer is next exposed to mercury to form a surface layer crystal of mercury cadmium telluride. Last, the layer of mercury cadmium telluride is etched to form a selected array of detector elements such as shown in FIGS. 1 and 2. A further method for fabricating a mercury cadmium telluride crystal for the detectors and blocking contacts in the present application is described in "Molecular Beam Epitaxial Growth of High Quality HgTe and $Hg_{1-x}Cd_xTe$ onto GaAs (001) Substrates," Applied Physics Letters 45(12), Dec. 15, 1984 by J. P. Fauve, S. Sivananthan, M. Boukerche and J. Reno.

A principal advantage for the structure of the present invention is the capability of producing an output signal for a detected infrared signal without the usual requirement of cooling the detector elements. A conventional infrared detector element is a planar element which has an area with dimensions which are substantially greater than the wavelength of the incident radiation. These large area elements are needed to capture the incoming infrared radiation. However, the infrared radiation striking the detector elements from directions other than the desired viewing angle generates noise that masks the desired signal. The solution to this problem has been to surround the detector elements on all sides except the viewing angle with a very cold material, such as liquid nitrogen.

In summary, the present invention includes a detector, array and imager designed principally for detecting infrared radiation by the use of dipole antennas which capture incident radiation and transfer it to a bandgap detector element. The detector element has dimensions which are substantially smaller than the wavelength of the incident radiation. A principal advantage of the present invention is the generation of an infrared imaging signal without cooling the detector elements.

Although several embodiments of the present invention have been described in the preceding detailed description, it is to be understood that the invention is not limited to the embodiments described but include all substitutions of parts and elements which fall within the scope of the invention.

What I claim is:

1. A device for detecting incident radiation, comprising:
a support structure,
a dipole antenna mounted on said support structure, said antenna having a length equal to approximately one half the wavelength of said radiation, and
a bandgap detector element mounted on said support structure and connected to said dipole antenna through blocking contacts, said detector element having each of the linear dimensions thereof less than the wavelength of said radiation, wherein said incident radiation is captured by said dipole antenna and transferred to said detector element which produces an output signal to indicate detection of said incident radiation.

2. A device for detecting incident radiation as recited in claim 1 wherein said bandgap detector element is mercury cadmium telluride crystal.

3. A device for detecting incident radiation as recited in claim 1 wherein said bandgap detector element is indium antimonide crystal.

4. A device for detecting incident radiation as recited in claim 1 wherein said bandgap detector element is a semiconductor superlattice crystal.

5. A device for detecting incident radiation as recited in claim 1 wherein each of said bandgap detector element linear dimensions is less than one tenth of the wavelength of said incident radiation.

6. A device for detecting incident radiation as recited in claim 1 for infrared radiation having a wavelength of approximately 10 microns wherein the length of said dipole antenna is approximately 5 microns and said detector element linear dimensions are each less than 1.0 microns.

7. A device for detecting incident radiation as recited in claim 1 for infrared radiation having a wavelength of approximately 5 microns wherein said detector element linear dimensions are less than 0.5 micron.

8. A device for detecting incident radiation as recited in claim 1 wherein said blocking contacts are mercury cadmium telluride crystal.

9. A device for detecting incident radiation as recited in claim 1 wherein said bandgap detector element is an uncooled detector element.

10. A device for detecting incident radiation, comprising:
a support structure,
a plurality of dipole antennas mounted on said support structure in a uniform array, each of said antennas having a length equal to approximately one half the wavelength of said radiation,
a plurality of bandgap detector elements connected respectively to said dipole antennas, through blocking contacts, each of said bandgap detector elements having each of the linear dimensions thereof less than the wavelength of said radiation, said bandgap detector elements connected in common, wherein said incident radiation is captured by said dipole antennas of said array and transferred to said detector elements which produce an output signal to indicate detection of said incident radiation.

11. A device for detecting incident radiation as recited in claim 10 wherein each of said bandgap detector elements in mercury cadmium telluride crystal.

12. A device for detecting incident radiation as recited in claim 10 wherein each of said bandgap detector elements is indium antimonide crystal.

13. A device for detecting incident radiation as recited in claim 10 wherein each of said bandgap detector elements is a semiconductor superlattice crystal.

14. A device for detecting incident radiation as recited in claim 10 wherein each of said detector element linear dimensions is less than one tenth of the wavelength of said incident radiation.

15. A device for detecting incident radiation as recited in claim 10 wherein said dipole antennas are positioned parallel within said array.

16. A device for detecting incident radiation as recited in claim 10 for infrared radiation having a wavelength of approximately 10 microns wherein the length of each of said dipole antennas is approximately 5 microns and each said detector element has linear dimensions less than 1.0 micron.

17. A device for detecting incident radiation as recited in claim 10 for infrared radiation having a wavelength of approximately 10 microns wherein the length of each of said dipole antennas is approximately 5 microns and each said detector element linear dimension is less than 0.5 microns.

18. A device for detecting incident radiation as recited in claim 10 wherein said blocking contacts are mercury cadmium telluride crystal.

19. A device for detecting incident radiation as recited in claim 10 wherein said bandgap detector element is an uncooled detector element.

20. An infrared radiation imager, comprising:
a support structure,
a plurality of detector arrays mounted on said support structure in a uniform pattern for receiving incident infrared radiation, each of said arrays for producing a pixel signal for an image which comprises said infrared radiation and is directed to said arrays, and
each of said arrays comprising a plurality of dipole antennas mounted on said support structure in a uniform pattern, each of said antennas having a length equal to approximately one half the wavelength of said infrared radiation, each said array further including a plurality of bandgap detector elements having each of the linear dimensions thereof less than the wavelength of said infrared radiation and connected via blocking contacts respectively to said dipole antennas and further connected to a common node for conveying said pixel signal therethrough, wherein said incident infrared radiation is captured by said dipole antennas and transferred to said detector elements for producing a pixel signal from each of said arrays, said pixel signals comprising said image.

21. An infrared radiation imager as recited in claim 20 wherein each of said bandgap detector elements is mercury cadmium telluride crystal.

22. An infrared radiation imager as recited in claim 20 wherein each of said bandgap detector elements is indium antimonide crystal.

23. An infrared radiation imager as recited in claim 20 wherein each of said bandgap detector elements is a semiconductor supperlattice crystal.

24. An infrared radiation imager as recited in claim 20 wherein each of said bandgap detector element linear dimension is less than one tenth of the wavelength of said infrared radiation.

25. An infrared radiation imager as recited in claim 20 herein said dipole antennas are positioned parallel within said arrays.

26. An infrared radiation imager as recited in claim 20 for infrared radiation having a wavelength of approximately 10 microns wherein the length of each of said dipole antennas is approximately 5 microns and said detector element linear dimensions are each less than 1.0 micron.

27. An infrared radiation imager as recited in claim 20 for infrared radiation having a wavelength of approximately 10 microns wherein the length of each of said dipole antennas is approximately 5 microns and said detector element linear dimensions are less than 0.5 microns.

28. An infrared radiation imager as recited in claim 20 wherein said blocking contact is a crystal of mercury cadmium telluride.

29. An infrared radiation imager as recited in claim 20 wherein said bandgap detector element is an uncooled detector element.

30. A device for detecting incident radiation, comprising:
   a support structure;
   an antenna mounted on said support structure; and
   a bandgap detector element mounted on said support structure and connected to said antenna through blocking contacts, said antenna comprising means for capturing said incident radiation and transferring it to said detector element, which produces an output signal indicative of detection of said incident radiation.

31. The apparatus of claim 30, wherein said antenna is impedence matched to said detector.

32. The apparatus of claim 30, wherein said antenna is a dipole antenna.

33. The apparatus of claim 30, wherein the length of said antenna is equal to approximately one half the wavelength of said radiation.

* * * * *